United States Patent [19]

Schreiden

[11] 4,305,021

[45] Dec. 8, 1981

[54] SWITCH FOR CONTROLLING THE OPERATION OF A LIGHT SOURCE IN RESPONSE TO THE PRESENCE OF A MOVING PERSON OR OBJECT AND IN RESPONSE TO THE MAGNITUDE OF AMBIENT LIGHT NOT PROVIDED BY THE LIGHT SOUCE

[75] Inventor: Jean Schreiden, 54 Bois de Mariomont, B-4804, Jalhay, Belgium

[73] Assignees: Jean Schreiden; Jacques Lecloux, both of Jalhay, Belgium

[21] Appl. No.: 74,278

[22] Filed: Sep. 11, 1979

[30] Foreign Application Priority Data

Sep. 11, 1978 [BE] Belgium ................................ 46602

[51] Int. Cl.³ ............................................ H05B 37/02
[52] U.S. Cl. .................................... 315/159; 307/116; 307/117; 315/360
[58] Field of Search ............... 315/149, 159, 360, 362; 307/116, 117, 157; 367/93; 340/541, 550, 552

[56] References Cited

U.S. PATENT DOCUMENTS 3,459,961  8/1969  Ravas ............................. 307/157 X
4,021,679  5/1977  Bolle et al. ...................... 367/93 X

*Primary Examiner*—Eugene R. LaRoche
*Attorney, Agent, or Firm*—Martin A. Farber

[57] ABSTRACT

A switch for controlling the operation of a light source in response to the presence of a moving person or object and in response to the magnitude of ambient light provided other than by the light source, said switch comprising means for detecting the presence of a moving body; timing means responsive to said detecting means, said timing means assuming a first condition for a selected period of time in response to the detection of a moving body by said detecting means; means for monitoring the magnitude of ambient light, said monitoring means assuming a first condition when the magnitude of ambient light is below or at a selected value and assuming a second condition when the magnitude of ambient light is above the selected value; and means for actuating a light source only when said timing means is in its first condition and when said monitoring means is in its first condition.

7 Claims, 1 Drawing Figure

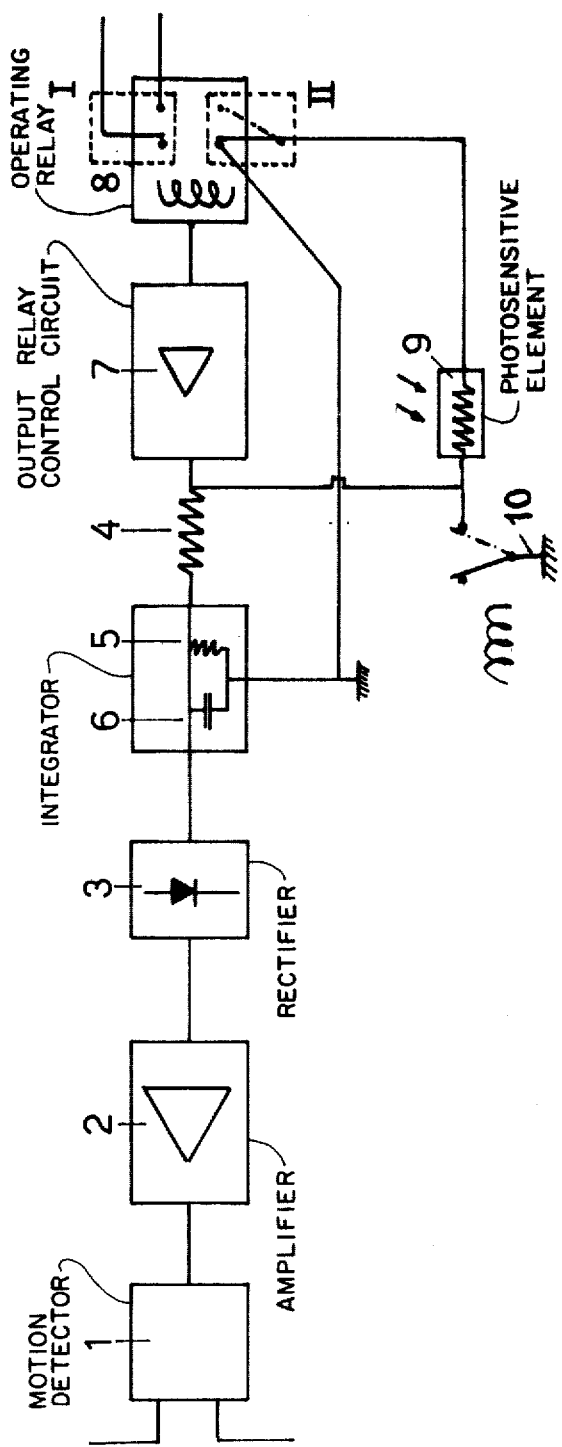

SWITCH FOR CONTROLLING THE OPERATION OF A LIGHT SOURCE IN RESPONSE TO THE PRESENCE OF A MOVING PERSON OR OBJECT AND IN RESPONSE TO THE MAGNITUDE OF AMBIENT LIGHT NOT PROVIDED BY THE LIGHT SOUCE

The invention relates to a completely automatic switch for controlling the lighting in an enclosure or room or in the open air, or adapted to be incorporated in one or more lights so that they operate automatically.

One object of the invention is automatically to prevent lights from staying on unnecessarily. It is known to use time-switches for this purpose but they have a disadvantage in that, after they have opened the light circuit after a given time, they need to be manually switched on again in order to close the circuit.

Another object of the invention is automatically to supply power to lights when required.

The aim of the invention is to construct a switching device having an automatically adjustable switching-on period, the operation of the device depending on the presence of a moving person or object within a certain radius and on the surrounding lighting conditions.

A switch according to the invention is characterised in that it comprises means for detecting the presence of a moving person or object in combination with a timing system responsive to the detecting device and a system comprising a photo-sensitive element for monitoring the surrounding lighting, independently of the lighting controlled by the switch.

According to another feature of the invention, the switch comprises an automatically re-set timing system.

The motion detecting device is an electro-magnetic wave (microwave) device or any similar device capable of delivering a voltage which varies in response to the motion of a person or object within its radius of action.

The motion detecting device is operatively connected to a timing means which is re-set whenever the device has detected the motion of a person or object within its radius of action. The object of the last-mentioned feature is, for example, to keep the lights in operation continuously for as long as desired.

For example, the switch can be adjusted to have a timing period of X seconds or minutes, in which case the light will be operative for a period T+X, where T represents the time during which persons, vehicles or objects are moving within the radius of action of the assembly.

The monitoring system incorporating a photo-sensitive element is provided to insure that the switch is able to actuate the light only at nightfall or when the surrounding lighting conditions are inadequate.

One of the main features of the photo-sensitive device according to the invention is that it can be placed without inconvenience in an illuminated region controlled by the switch. This will be demonstrated in the following description.

The accompanying drawing, by way of example only, is a diagram of a switch constructed according to the invention.

As can be seen in the drawing, the switch comprises a micro-wave motion detector 1, an amplifier 2, a rectifying circuit or relay 3, an integrating circuit including a capacitor 6 and a resistor 5 coupled such that the capacitor has a time constant discharge or decay time, an output relay control circuit (thyristors) 7, and an operating relay 8.

A photo-sensitive element 9 such as a resistor LDR or photodiode is connected in parallel to the input of the output relay control circuit 7.

When, for example, a person moves near the motion detector, the voltage from amplifier 2 charges capacitor 6 via rectifier 3. The voltage is transmitted via a resistor 4 to the relay control circuit 7 and actuates relay 8 into an operative position in which its contacts I allow power to be supplied to the light (not shown). When such actuation occurs, the contact II is caused to be in an open position to disconnect the photo-sensitive element 9 so that operation of the switch is not influenced by the illumination supplied by a light controlled by contacts I. When motion stops within the field of action of detector 1, capacitor 6 gradually discharges over a desired period of time, after which the capacitor charge is so low that the relay 8 changes into the inoperative position, whereby photo-sensitive element 9 is connected in parallel to the input of control circuit 7 by contacts II of relay 8 (in continuous lines); In such inoperative position, a voltage from the integrator connected to resistor 4 cannot appear at the terminals of circuit 7 unless element 9 has stopped conducting or has a sufficiently high resistance (i.e. when the LDR cell or photodiode is in darkness). Consequently, relay 8 cannot be actuated unless the photosensitive element 9 is in darkness.

The sensitivity of the motion detecting device and of the photo-sensitive device are adjustable, so that the switch can be adapted in optimum manner for any desired application.

According to another feature of the invention, the switch includes a safety circuit preventing it from being switched on again for a desired period of time after it has changed to the inoperative position. To this end, as shown in the drawing, the contacts (in discontinuous lines) of auxiliary relay 10 close during such period to prevent any switching on.

The aforementioned switch is usually contained in a single location or in a box, but may also have the motion detecting elements or the photo-sensitive elements or both positioned generally remote from the other elements of the switch. Moreover, the switch may be a component of a larger light control assembly.

Of course, the switching operations performed by relays can be performed by semi-conductors (thyristors, etc.).

I claim:

1. A switch for controlling the operation of a light source in response to the presence of a moving person or object and in response to the magnitude of ambient light provided other than by the light source, said switch comprising:

means for detecting the presence of a moving body;

timing means responsive to said detecting means, said timing means assuming a first condition for a selected period of time in response to the detection of a moving body by said detecting means;

means for monitoring the magnitude of ambient light, said monitoring means assuming a first condition when the magnitude of ambient light is below or at a selected value and assuming a second condition when the magnitude of ambient light is above the selected value; and means for actuating a light source only when said timing means is in its first condition and when said monitoring means is in its first condition.

2. A switch according to claim 1 wherein said detecting means comprises a means for producing a voltage in response to a body moving within a certain space.

3. A switch according to claim 2 wherein said detecting means includes a microwave detector.

4. A switch according to claim 1 wherein said timing means includes an integrator having a selectable, variable time constant.

5. A switch according to claim 1 wherein said detecting means is selectively, variably sensitive to the motion of a moving body.

6. A switch according to claim 1 wherein said monitoring means condition determining value may be selectively, variably adjusted.

7. A switch according to claim 1 further including safety means for preventing said actuating means from actuating a light source for a selected period of time after said actuating means has ceased actuating the light source.

* * * * *